United States Patent
Hossain et al.

(10) Patent No.: US 6,242,785 B1
(45) Date of Patent: Jun. 5, 2001

(54) NITRIDE BASED SIDEWALL SPACES FOR SUBMICRON MOSFETS

(75) Inventors: Tim Z. Hossain; Amiya R. Ghatak-Roy; Clive Jones, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/236,890

(22) Filed: Jan. 26, 1999

(51) Int. Cl.$^7$ ............................ H01L 29/76; H01L 29/94; H01L 31/062; H01L 31/113; H01L 31/119
(52) U.S. Cl. ........................ 257/412; 257/408; 257/411; 257/413
(58) Field of Search .................................. 257/401, 408, 257/411, 412, 413

(56) References Cited

U.S. PATENT DOCUMENTS

| | | |
|---|---|---|
| 4,743,564 | 5/1988 | Sato et al. . |
| 4,908,326 | 3/1990 | Ma et al. . |
| 4,949,136 * | 8/1990 | Jain ...................................... 357/23.3 |
| 5,089,865 * | 2/1992 | Mitsui et al. ........................ 357/23.4 |
| 5,324,974 | 6/1994 | Liao . |
| 5,334,870 | 8/1994 | Katada et al. . |
| 5,346,578 | 9/1994 | Benzing et al. . |
| 5,405,480 | 4/1995 | Benzing et al. . |
| 5,621,241 | 4/1997 | Jain . |
| 5,641,546 | 6/1997 | Elwell et al. . |
| 5,648,284 | 7/1997 | Kusunoki et al. . |
| 5,719,425 | 2/1998 | Akram et al. . |
| 5,780,896 | 7/1998 | Ono . |
| 5,818,092 * | 10/1998 | Bai et al. .............................. 257/388 |
| 5,847,428 * | 12/1998 | Fulford, Jr. et al. ................. 257/344 |
| 5,895,955 * | 4/1999 | Gardner et al. ...................... 257/336 |
| 5,905,293 * | 5/1999 | Jeng et al. ........................... 257/408 |
| 5,937,315 * | 8/1999 | Xiang et al. ......................... 438/486 |

OTHER PUBLICATIONS

Wolf, "Silicon Processing For the VLSI Era, vol. 3: the Submicron MOSFET," Lattice Press, Sunset Beach, California, 1995, pp. 660–661.

* cited by examiner

Primary Examiner—Olik Chaudhuri
Assistant Examiner—Shrinivas Rao
(74) Attorney, Agent, or Firm—Kevin L. Daffer; Conley, Rose & Tayon P.C.

(57) ABSTRACT

A transistor and a method for making a transistor are described. A silicon gate conductor is patterned over a gate dielectric upon a silicon substrate. Dopant impurity distributions self-aligned to the gate conductor may be introduced. Silicon nitride ("nitride") spacers are formed adjacent to opposed sidewall surfaces of the gate conductor. Oxide caps are formed covering exposed outer surfaces of the nitride spacers. The oxide caps prevent dissociation of the nitride spacers during a subsequent pre-amorphization implant. A preclean is subsequently used to remove oxides from the surfaces of the gate conductor and semiconductor substrate. The preclean may also remove the oxide caps, but does not attack the nitride spacers. A salicide process is used to form low-resistance gate, source, and drain silicides. The presence of nitrogen in the nitride spacers is believed to help prevent dopant outdiffusion from adjacent silicon, prevent silicide bridging across spacers, and increase resistance of the spacers to oxide etchants.

12 Claims, 5 Drawing Sheets

NITRIDE BASED SIDEWALL SPACES FOR SUBMICRON MOSFETS

BACKGROUND OF THE INVENTION

1. Field of the Invention

This invention relates to integrated circuit fabrication and, more particularly, to silicon nitride based sidewall spacers exhibiting improved reliability during transistor fabrication, and to a method for forming a transistor using these spacers.

2. Description of the Related Art

Fabrication of a metal-oxide-semiconductor (MOS) integrated circuit involves numerous processing steps. Typically, a gate dielectric is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and a drain. Dielectric spacers are often formed on the sidewalls of the gate conductor and used to form lightly-doped drain (LDD) portions of the source and drain. According to the conventional method of forming these LDD regions, the above-mentioned dopant impurities are introduced in two steps. A first impurity introduction is performed after gate conductor formation to form impurity distributions self-aligned to sidewalls of the gate conductor. A conformal dielectric layer, typically a silicon dioxide ("oxide") layer is subsequently blanket deposited over the semiconductor substrate and gate conductor. This oxide layer is anisotropically etched more rapidly in a vertical than a horizontal direction, so that oxide spacers are formed adjacent to the gate conductor sidewalls. A second impurity introduction is subsequently performed to form impurity distributions self aligned to lateral surfaces of the spacers. The impurity distributions formed by the second impurity introduction have higher carrier concentration and extend farther into the substrate than those formed by the first impurity introduction.

The impurity distributions formed by the first and second impurity introductions combine to form source and drain regions which include relatively shallow and lightly-doped portions, or LDD regions, underneath the sidewall spacers. Such LDD regions reduce the maximum electric field at the drain/channel interface in a MOSFET. The reduction in electric field lowers the kinetic energy gained by electrons in the MOSFET channel, thereby mitigating undesirable "hot-carrier" effects. Hot-carrier effects include avalanche breakdown at the drain/substrate junction and injection of carriers into the gate dielectric.

In addition to their use in forming LDD regions, sidewall spacers are useful in forming a self-aligned silicide, or salicide, subsequent to source and drain formation. Salicides are formed in order to provide relatively broad-area, low-resistivity (and therefore low-resistance) contacts to the source, drain, and gate of a transistor. In a salicide process, a metal film is blanket-deposited over the exposed surfaces of a transistor containing sidewall spacers, after formation of the source and drain regions. The transistor is subjected to a heating process which causes a reaction between the metal and silicon that the metal is in contact with, forming a silicide on the silicon surfaces. Unreacted metal, such as that deposited over the sidewall spacers, is subsequently removed, leaving the silicide covering only the gate, source, and drain regions.

Despite the above-described benefits of sidewall spacer formation, there are reliability problems associated with sidewall spacers. As noted above, spacers are typically formed from a deposited oxide layer. Such oxide spacers are susceptible to attack by the hydrofluoric acid (HF) based etches typically used to clean native oxides from the gate, source and drain surfaces prior to the salicide process metal deposition. In addition, some of the dopant impurities used in transistor fabrication diffuse readily through oxide. In particular, boron is known to exhibit significant outdiffusion from silicon into overlying oxide layers during MOSFET fabrication. In a p-channel transistor, for example, boron may diffuse from the p-type source and drain into oxide sidewall spacers. This outdiffusion of boron from the substrate lowers the carrier concentration of the source and drain regions, thereby increasing series and contact resistances associated with the source and drain.

Another reliability problem which may be associated with oxide spacers is "bridging" over spacers during self-aligned silicide, or salicide, processes. Bridging occurs when silicon atoms which are not bonded into the spacer insulator are present on the surface of the spacer, so that a silicide is formed over the spacers. This silicide remains when unreacted metal is removed, so that silicide bridging from the gate to source or drain regions may occur. Silicon atoms which cause bridging may diffuse from the gate, source and/or drain regions into the metal overlying the sidewall spacers, so that a silicide is formed. Titanium is a popular silicide metal because it has a very low resistance. Unfortunately, titanium salicide processes are particularly prone to bridging.

A promising approach to the reliability problems described above is to use silicon nitride ("nitride"), rather than oxide, for spacer formation. First of all, nitride is not susceptible to attack by the HF-based etches used to remove native oxides. Nitride is also believed to be more resistant to dopant diffusion than oxide. Spacers formed with nitride may therefore limit outdiffusion of impurities from the gate and/or source/drain regions. This diffusion limiting capability may be especially significant in the case of p-channel transistors, which are typically implanted with boron. As noted above, boron is known to exhibit significant outdiffusion from silicon into adjacent oxide layers during MOSFET fabrication. Furthermore, the presence of nitrogen in a sidewall spacer is believed to limit the bridging, described above, which can occur during salicide formation. Using a nitrogen ambient during the titanium silicide reaction process is known to prevent bridging during titanium salicide processes. The presence of nitrogen is believed to lower the diffusivity of silicon in titanium. Formation of a nitride spacer may therefore provide a source of nitrogen to reduce bridging across the spacer.

Although nitride spacers may alleviate some spacer reliability problems, as discussed above, other reliability problems can result from their use. For example, pre-amorphization implants often used prior to salicide formation may cause dissociation of the surface region of nitride spacers, as discussed further below.

Many modern transistor fabrication processes involve short (less than 1 micron long) polysilicon gate conductors. When silicides are formed on upper surfaces of these gate conductors, the resulting gate structure is termed a "polycide" structure. These polycide gate conductors have been found to exhibit geometry-dependent resistivity, with shorter-length gate conductors having higher resistivity. It has been theorized that regions of high resistivity polysilicon, in which mobile carriers become easily trapped, exist in the vicinity of the grain boundaries characteristic of polysilicon films. As these regions become comparable in size to the overall length of the polysilicon gate conductor, insufficient quantities of silicon may be available for the formation of high quality silicides. When such a condition occurs, the formation rate and quality of silicides formed on the upper surface of short-length polysilicon gate conductors may drop below the formation rate and quality of silicides formed on wider polysilicon structures. The increased resistivity exhibited by short-length gate conductor polycides results in an increased gate contact resistance, which reduces the speed of the transistor. Furthermore, geometry-dependent silicide resistivity is undesirable because semiconductor devices and process are almost universally designed and simulated under the assumption that silicide resistivity will not exhibit a geometric dependence.

An approach which has been found useful in reducing the resistivity of short polysilicon gate conductor silicides is the use of an amorphizing implant prior to metal deposition. In such a pre-amorphization implant, non-dopant atoms such as Si or Ge are typically implanted into upper surface regions of the polysilicon gate conductor, the source and drain regions, and the sidewall spacers. This implant is believed to break up the grain boundaries in the upper surface portion of the polysilicon gate conductor, such that a lower-resistivity silicide layer may subsequently be formed. Unfortunately, such an implant tends to dissociate silicon nitride, resulting in unbound Si atoms on the surface of nitride spacers. These Si atoms may subsequently react with a deposited metal, forming silicide over the nitride spacers. It is postulated that the bond recombination energies associated with nitride and oxide are such that silicon from dissociated nitride is more likely to form a silicide when heated with a metal during a salicide process than to re-form nitride. Silicon from dissociated oxide, on the other hand, is believed to be more likely to re-form oxide during a salicide process. In this way, the silicide bridging described above may occur if dissociated nitride is present on the nitride spacers.

It would therefore be desirable to develop nitride-based sidewall spacers which are resistant to dissociation by pre-amorphization implants. The desired spacers should minimize reliability problems associated with many typical oxide spacers, such as dopant diffusion and salicide bridging.

SUMMARY OF THE INVENTION

The problems outlined above are addressed herein by a transistor having nitride-based sidewall spacers formed with a protective oxide cap layer, and a method for fabricating this transistor. A gate conductor is patterned over a gate dielectric upon a semiconductor substrate and/or semiconductor topography. Dopant impurities of opposite type to that of the substrate may be introduced, forming dopant distributions which are self-aligned to sidewalls of the gate conductor. Silicon nitride sidewall spacers are formed adjacent sidewalls of the gate conductor. A thin conformal oxide layer is subsequently deposited over the substrate, spacers, and gate conductor. The oxide layer is then anisotropically etched so that substantially horizontal portions of the oxide layer are removed. This results in a thin oxide cap extending over substantially the entirety of the nitride spacer. The oxide cap thickness is chosen to be greater than or equal to the planned depth in the oxide of a subsequent pre-amorphization implant. In this way, the nitride spacer is protected from dissociation during the pre-amorphization implant. The oxide cap is typically removed subsequent to this implant, by an HF-based etch used to preclean the silicon surfaces prior to metal deposition.

The underlying nitride spacer is resistant to attack by HF-based etchants, so that an intact nitride spacer may be used in the subsequent salicide process. The nitride spacer is believed to not be dissociated by the pre-amorphization implant, because damage from this implant is substantially confined to the overlying oxide cap. Use of the nitride spacer is believed to confer reliability advantages to the fabricated transistor. First of all, the shape and integrity of the nitride spacer are maintained during the HF-based preclean, in contrast to the degradation suffered by oxide spacers during such a process. In addition, nitride is more resistant to dopant diffusion than oxide. Spacers formed by the method recited herein are therefore believed to limit outdiffusion of impurities from the gate and/or source/drain regions. This diffusion-limiting capability may be especially significant in the case of p-channel transistors, which are typically implanted with boron. As noted above, boron is known to exhibit significant outdiffusion from silicon into adjacent oxide layers during MOSFET fabrication. Furthermore, the presence of nitrogen in a sidewall spacer is believed to limit the bridging, described above, which can occur during salicide formation. Using a nitrogen ambient during the titanium silicide reaction process is known to prevent bridging during titanium salicide processes. The presence of nitrogen is believed to lower the diffusivity of silicon in titanium. It is therefore contemplated that formation of a nitride spacer as recited herein provides a source of nitrogen to reduce bridging across the spacer. The sacrificial oxide cap present during the pre-amorphization implant is believed to prevent implant-induced dissociation of the nitride, which can also result in bridging.

Dopant impurities are typically introduced into the semiconductor substrate to form source and drain regions. A first impurity introduction may be performed before formation of the nitride spacers, to form shallow LDD impurity distributions self-aligned to the gate conductor. A second impurity introduction may be performed subsequent to formation of the nitride spacers, to form deeper source and drain regions suitable for silicide and contact formation. The oxide cap described above may be formed before or after this second impurity introduction.

In addition to the transistor fabrication method described above, a transistor is contemplated herein. In one embodiment of the transistor, silicides are not yet formed on the source, drain, and gate. A polysilicon gate conductor is dielectrically spaced over a semiconductor substrate. An upper portion of the gate conductor is amorphous, rather than polycrystalline, and includes implanted atoms. In an embodiment, these implanted atoms are non-dopant atoms such as silicon or germanium. Nitride sidewall spacers are arranged upon the silicon substrate, adjacent opposed sidewall surfaces of the gate conductor. A thin pad oxide may be interposed between the nitride spacers and the semiconductor substrate. An oxide cap is arranged adjacent an exposed outer surface of each sidewall spacer, such that the exposed outer surfaces of the spacers are substantially covered by the oxide caps. The oxide caps include implanted atoms of the same species as those implanted into the upper portion of the gate conductor. The oxide cap thickness is chosen such that structural damage associated with the implanted atoms is substantially confined to the oxide cap. In an embodiment, the oxide cap thickness is approximately equal to the extent of the amorphized portion of the gate conductor, as measured from the gate conductor upper surface.

In an alternative embodiment of the transistor, silicide regions are formed on the transistor source, gate, and drain. A polysilicon gate conductor is dielectrically spaced over a semiconductor substrate. Nitride sidewall spacers are arranged upon the silicon substrate, adjacent opposed sidewall surfaces of the gate conductor. A thin pad oxide may be interposed between the nitride spacers and the semiconductor substrate. The nitride spacers are substantially free of structural damage. Source and drain impurity distributions are arranged within the semiconductor substrate, laterally displaced on either side of the gate conductor. Silicides are arranged upon upper surfaces of the source and drain regions, laterally adjacent to the nitride spacers. A gate silicide is arranged upon the upper surface of the gate conductor. The nitride spacers are substantially free of overlying silicide, and no silicide connection exists between the gate and the source or drain. The resistivity of the gate silicide is approximately equal to the resistivities of the source and drain silicides.

BRIEF DESCRIPTION OF THE DRAWINGS

Other objects and advantages of the invention will become apparent upon reading the following detailed description and upon reference to the accompanying drawings in which.

Figure 1:
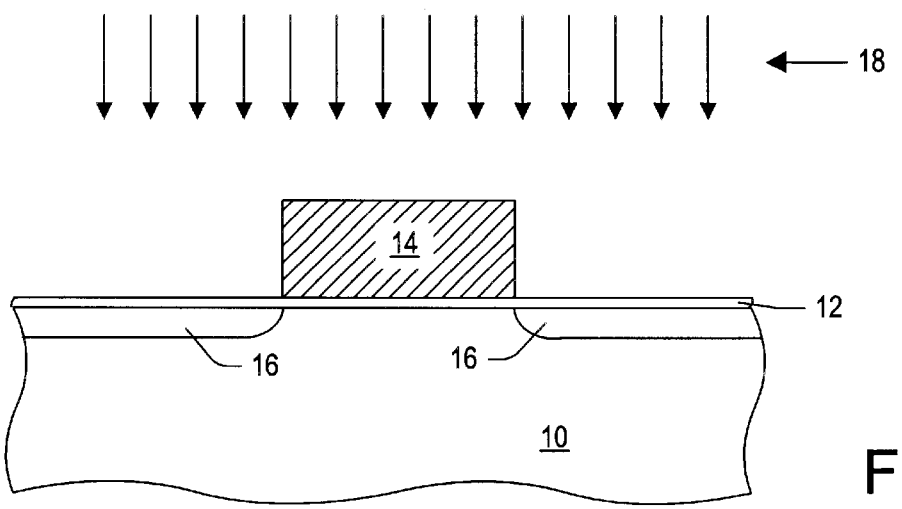
FIG. 1 is a partial cross-sectional view of a semiconductor topography including a silicon substrate upon which a gate dielectric is formed and a gate conductor is patterned and into which impurity distributions are introduced.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, FIG. 1 illustrates a partial cross-section of a semiconductor topography including a silicon gate conductor 14 and a gate dielectric 12 arranged above silicon substrate 10. Impurity distributions 16 may be introduced into substrate 10, self-aligned to gate conductor 14 using impurity introduction process 18. In this case, portions of gate dielectric 12 not covered by gate conductor 14 have been retained. Alternatively, these portions may be removed after patterning of gate conductor 14.

Silicon substrate 10 is preferably monocrystalline silicon, and is doped either n-type or p-type. For example, substrate 10 may be an epitaxial silicon layer grown on a monocrystalline silicon substrate, or an n-type or p-type well region formed in a monocrystalline silicon substrate. Substrate 10 may also be a silicon layer formed upon an insulator formed over a semiconductor substrate. Although not shown, dielectric isolation regions may be formed which separate impurity regions 16 from source and drain regions of adjacent transistors. One method by which such isolation regions may be formed is the formation of trenches which are subsequently filled with a deposited dielectric, while another method which may be used is local oxidation of the substrate, using silicon nitride to mask the active regions in which transistors are to be formed. Gate dielectric 12 is preferably grown by heating substrate 10 to a temperature of greater than about 700° C. in an oxidizing ambient to grow oxide. Other gate dielectrics may be used, however, including nitride, nitrided oxide, silicon oxynitride, and deposited oxide. If nitride is used for gate dielectric 12, a thin pad oxide may also be formed between the nitride and the substrate.

Silicon gate conductor 14 is preferably a polysilicon gate conductor patterned from a polysilicon layer which is deposited using chemical vapor deposition (CVD) of silicon from, for example, a silane source. Such a CVD process may alternatively result in an amorphous silicon layer, particularly if low substrate temperatures are used. Such an amorphous silicon layer may also be patterned to form gate conductor 14. Subsequent high-temperature processing, such as that associated with source and drain impurity introduction, results in formation of a polysilicon gate conductor even if an amorphous silicon layer is initially deposited. Gate conductor 14 typically has a thickness between about 1000 angstroms and about 3000 angstroms. The gate conductor may have any length which is compatible with the desired device performance and the capabilities of the overall fabrication process. The improved gate silicide resistivity which is contemplated as a result of the pre-amorphization implant included in the method recited herein is believed to be most significant for short-channel devices, having a gate length less than or equal to about 2 microns. Devices having gate length less than or equal to about 0.5 micron are particularly expected to benefit, since geometry-dependent polycide resistivity is believed to be most significant for very short gates.

Impurity introduction process 18 is preferably an ion implantation process. For formation of an LDD region, a typical implant dose may be in a range from about $8 \times 10^{14}$ $cm^{-2}$ to about $5 \times 10^{15}$ $cm^{-2}$, and the implant energy may be in a range from about 600 eV to 5 keV. Impurity distributions 16 are of opposite type to that of substrate 10. For an n-channel transistor, for example, substrate 10 is p-type and distributions 16 are n-type. Typical n-type dopants include arsenic, phosphorus and antimony, while boron is a typical p-type dopant. If source and drain impurity distributions 16 are introduced by ion implantation, a subsequent anneal is performed in order to activate the impurities and repair damage to substrate 10.

Figure 2:
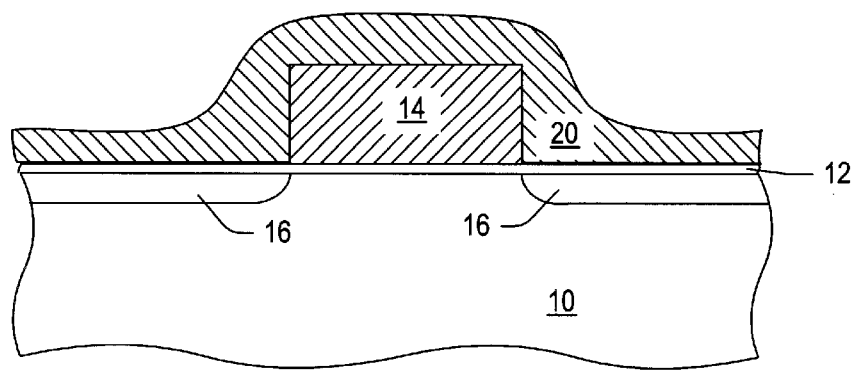
FIG. 2 is a partial cross-sectional view of the semiconductor topography wherein a conformal nitride layer is formed over the gate conductor and substrate, subsequent to the impurity introduction of FIG. 1.

Conformal nitride layer 20 is subsequently formed over gate conductor 14 and substrate 10, as shown in FIG. 2. Nitride layer 20 is preferably deposited by CVD using a silane source. In particular, plasma-enhanced CVD (PECVD) may be used to deposit a very conformal film at substrate temperatures between about 200° C. and 400° C. Other techniques which may be suitable for deposition of nitride layer 20 include low-pressure CVD (LPCVD) and atmospheric pressure (CVD) (APCVD).

Figure 3:
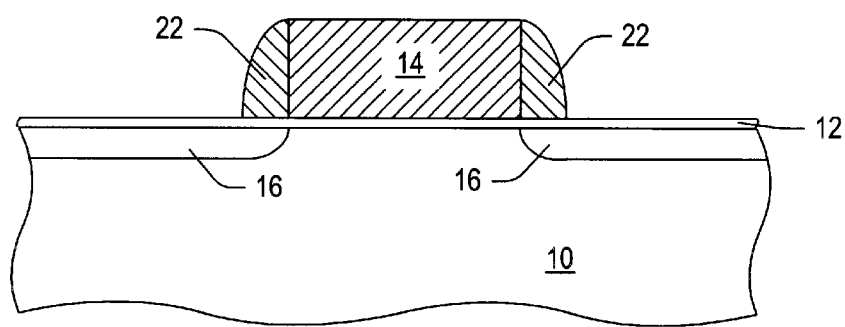
FIG. 3 is a partial cross-sectional view of the semiconductor topography wherein portions of the nitride layer are removed such that nitride spacers are formed, subsequent to the nitride layer formation of FIG. 2.

Portions of nitride layer 20 are subsequently removed to form nitride spacers 22, as shown in FIG. 3. The removal is preferably accomplished using an anisotropic etching process which etches more rapidly in a vertical than in a horizontal direction. In the embodiment of FIG. 3, spacers 22 are formed above portions of gate dielectric 12. This may be advantageous particularly in embodiments for which gate dielectric 12 is formed from oxide, in that the portions of gate dielectric 12 underlying nitride spacers 22 may act as "pad oxides" for nitride spacers 22. Such pad oxides may help to relieve strain and minimize defects at interfaces between nitride and silicon. Portions of gate dielectric 12 not covered by gate conductor 14 or spacers 22 may be retained, as shown in FIG. 3, or removed during formation of nitride spacers 22.

Figure 4:
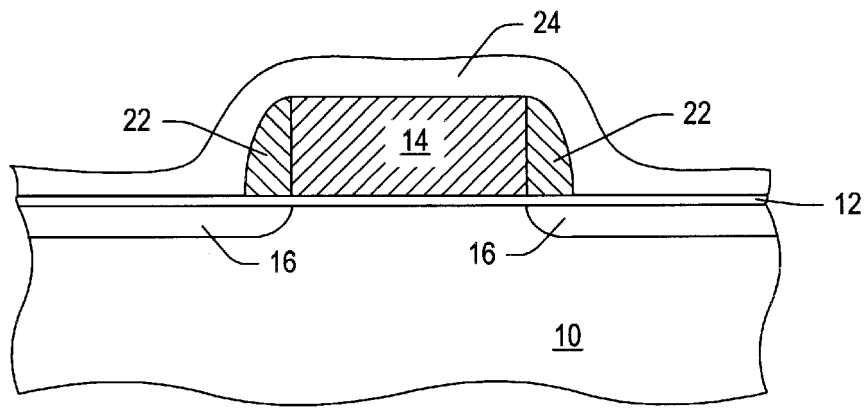
FIG. 4 is a partial cross-sectional view of the semiconductor topography wherein a conformal oxide layer is formed over the gate conductor, nitride spacers, and substrate, subsequent to the nitride spacer formation of FIG. 3.

Conformal oxide 24 is subsequently deposited over gate conductor 14, nitride spacers 22, and substrate 10, as shown in FIG. 4. Oxide 24 is preferably deposited by CVD. In particular, decomposition of tetraethyl orthosilicate (TEOS) may be performed in a PECVD reactor at a substrate temperature in the range from about 200° C. to about 500° C. to produce a very conformal film. Other techniques which may be used to deposit oxide 24 include PECVD using a silane source, and LPCVD or APCVD using silane or TEOS sources.

Figure 5:
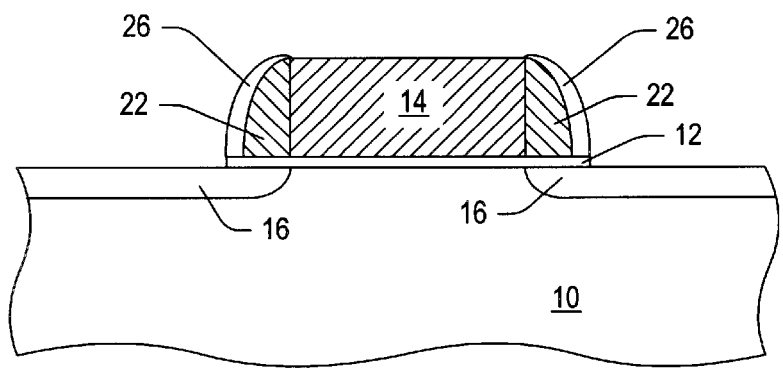
FIG. 5 is a partial cross-sectional view of the semiconductor topography wherein portions of the conformal oxide layer are removed such that oxide caps are formed, subsequent to the oxide layer formation of FIG. 4.

Substantially horizontal portions of oxide 24 are subsequently removed to form oxide caps 26 over nitride spacers 22, as shown in FIG. 5. As in the case of formation of spacers 22, formation of oxide caps 26 is preferably achieved using an anisotropic etching process which etches more rapidly in a vertical than in a horizontal direction. The deposition and etching conditions used to form oxide caps 26 are chosen such that oxide caps 26 are thick enough to contain any structural damage which may result from a subsequent pre-amorphization implant. Because implantation depths into oxide are typically smaller than implantation depths into polysilicon for the same implantation conditions, a useful guideline may be to make the thickness of oxide caps 26 greater than or equal to a planned thickness of the polysilicon gate region amorphized by this implant. As illustrated in FIG. 5, the thickness of oxide caps 26 may not be uniform over the entire surface of nitride spacers 22. Furthermore, portions of spacers 22, particularly at the upper end, may not be completely covered by oxide caps 26. As long as substantial portions of spacers 22 are covered by oxide caps 26, the protective function of oxide caps 26 is believed to be preserved, as described in more detail below. If not removed in prior processing, portions of gate dielectric 12 not covered by gate conductor 14, spacers 22, or caps 26 are removed during formation of oxide caps 26, as shown in FIG. 5.

Figure 6:
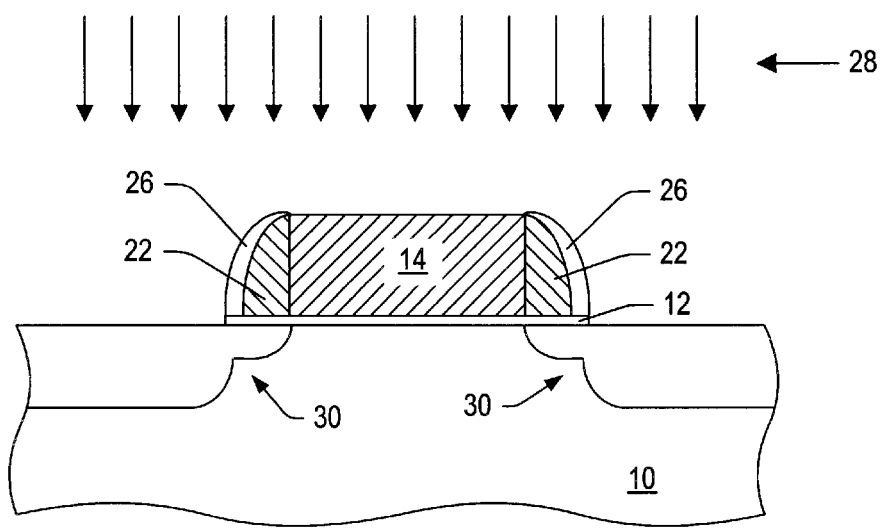
FIG. 6 is a partial cross-sectional view of the semiconductor topography wherein an additional impurity distribution is introduced, subsequent to the oxide cap formation of FIG. 5.

Impurity introduction process 28 may subsequently be performed to complete source and drain regions 30, as shown in FIG. 6. Impurity introduction 28 is preferably an ion implantation process having higher dose and higher energy than those of impurity introduction 18 in FIG. 1. Source and drain regions 30 thereby include deeper, more heavily doped regions aligned with exposed lateral sidewalls of oxide caps 26, and LDD regions below nitride spacers 22. Impurity introduction 28 could also be performed before formation of oxide caps 26, after the nitride spacer formation of FIG. 3. In that case, the deeper portions of source and drain regions 30 would be aligned to sidewalls of nitride spacers 22. In addition to completing the formation of source and drain regions 30, impurity introduction 28 may serve to dope gate conductor 14, such that a transistor is formed. Gate conductor 14 may also be doped during polysilicon deposition, or using a separate impurity introduction.

Figure 7:
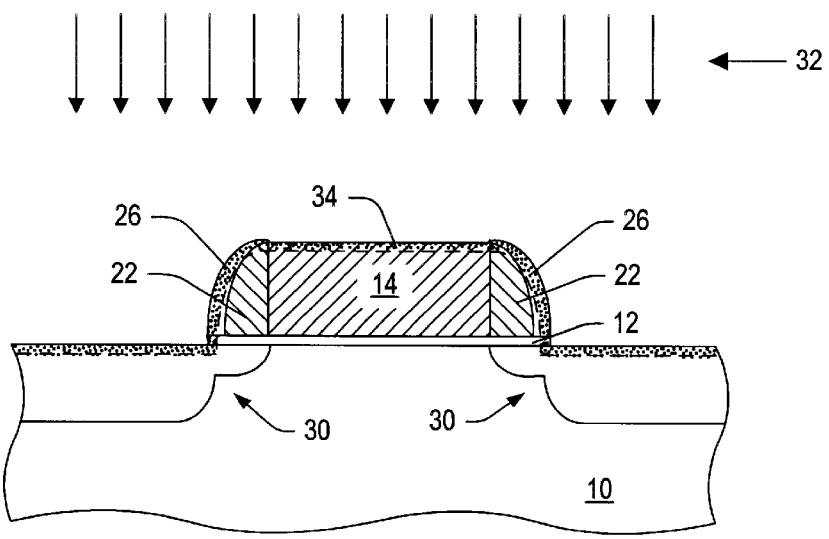
FIG. 7 is a partial cross-sectional view of the semiconductor topography wherein a pre-amorphization implant is performed, subsequent to the impurity introduction of FIG. 6.

Turning now to FIG. 7, pre-amorphization implant 32 is performed, creating amorphized (in the case of silicon) or damaged (in the case of dielectrics) region 34. Region 34 is indicated using dots in FIG. 7, and the boundary of region 34 is shown with a dashed line. The depth of region 34 is not necessarily uniform across the gate conductor, oxide cap, and substrate upper surfaces. For example, implanted atoms may travel farther into polysilicon than into monocrystalline silicon for a given set of implantation conditions. Furthermore, implanted atoms are believed to generally penetrate farther into silicon than into dielectric materials. The depth of region 34 may therefore, for example, be greatest within gate conductor 14 and smallest within oxide caps 26. Implant 32 preferably introduces atoms which are not electrically active in silicon, such as silicon or germanium atoms, because the implant is intended to alter the structural, rather than the electrical properties of the silicon. Other impurities which may be suitable for implant 32 include argon, nitrogen and oxygen. In some embodiments, use of a dopant impurity such as boron or phosphorus may be suitable. If a dopant impurity is used, the dopant is of opposite type to that of substrate 10.

The dose and energy used for amorphization implant 32 are adjusted depending on the impurity used and the depth of amorphization of gate conductor 14 desired. Exemplary impurity doses may range from about $10^{14}$ atoms/cm$^2$ to about $10^{17}$ atoms/cm$^2$, though doses outside of this range may also be appropriate with suitable impurity and energy choices. Typical implant energies may range from about 10 keV to about 100 keV, although other energies may also be suitable depending on the impurity and dose chosen. Typical depths of amorphized region 34 within gate conductor 14 may range from about 50 angstroms to about 200 angstroms.

As noted above, dielectric structural damage resulting from implant 32 may be substantially contained within oxide caps 26 if caps 26 have a thickness greater than or equal to the depth of region 34 within gate conductor 14.

Figure 8:
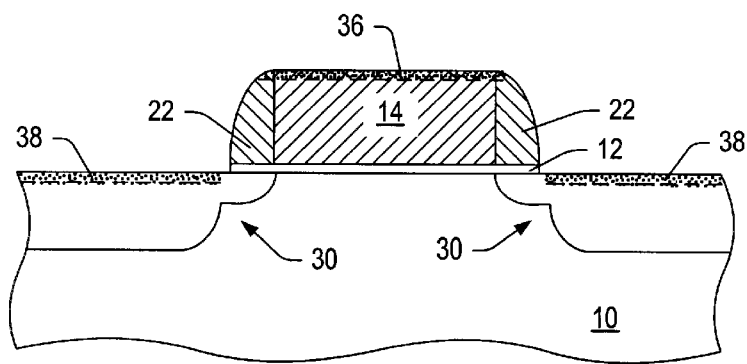
FIG. 8 is a partial cross-sectional view of the semiconductor topography wherein silicon surfaces are cleaned and the oxide caps are removed, subsequent to the pre-amorphization implant of FIG. 7.

Subsequent to pre-amorphization implant 32, a preclean is performed to remove any oxides from the surfaces of gate conductor 14 and substrate 10, in preparation for forming silicides. This preclean may also remove oxide caps 26, as shown in FIG. 8. The preclean is preferably performed using a dilute HF solution. The transistor of FIG. 8 includes gate conductor 14, source and drain regions 30, nitride spacers 22, gate amorphized portion 36, and source/drain amorphized portions 38. Nitride spacers 22 are not attacked by such an HF solution, and therefore remain intact during subsequent processing. In the embodiment of FIG. 8, portions of gate amorphized portion 36 extend into upper ends of nitride spacers 22. This may result from incomplete protection of upper ends of spacers 22 by oxide caps 26 during implant 32, as shown in FIG. 7.

Figure 9:
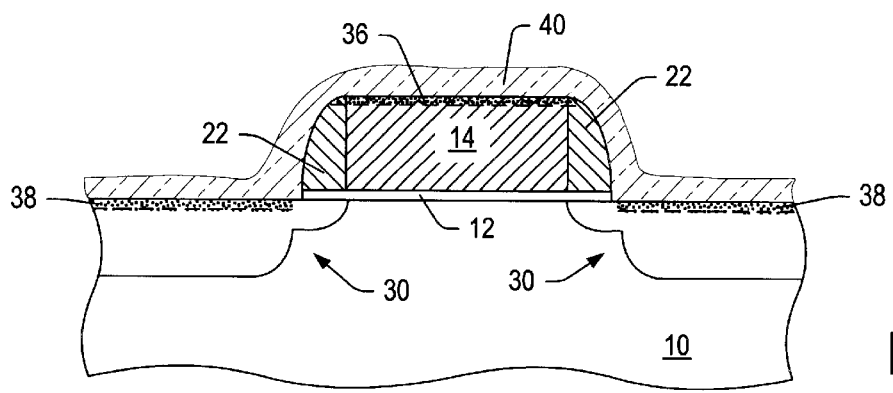
FIG. 9 is a partial cross-sectional view of the semiconductor topography wherein a metal layer is deposited over the gate conductor, nitride spacers, and silicon substrate, subsequent to the cleaning of FIG. 8.
Figure 10:
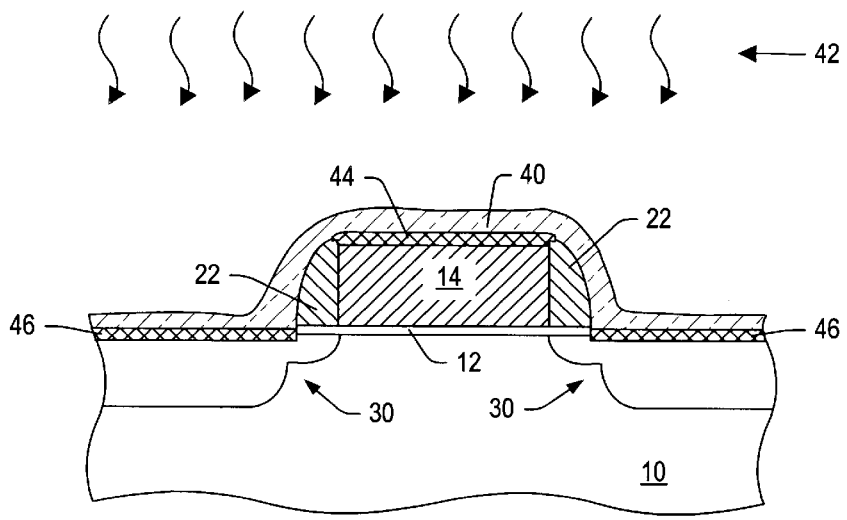
FIG. 10 is a partial cross-sectional view of the semiconductor topography wherein the metal is reacted with underlying silicon to form silicides, subsequent to the metal deposition of FIG. 9.

Metal layer 40 may subsequently be deposited over gate conductor 14, spacers 22 and substrate 10, as shown in FIG. 9. Metal layer 40 is preferably formed from titanium or cobalt, but may include other metals with which silicides may be formed, such as platinum, tungsten, tantalum, palladium, or nickel. Deposition techniques for formation of metal layer 40 may include CVD and physical deposition techniques such as sputtering. Thermal process 42 is used to react portions of metal layer 40 with underlying silicon, as shown in FIG. 10. Thermal process 42 preferably includes heating substrate 10 to a temperature greater than about 600° C. in an inert ambient such as nitrogen, argon, or forming gas (nitrogen with 5% hydrogen). The heating may be performed in a rapid thermal annealing system or in a standard furnace. Portions of metal layer 40 which are in contact with silicon react with the silicon to form gate silicide 44 and source/drain silicides 46. In the embodiment of FIG. 10, portions of gate silicide 44 extend over upper portions of nitride spacers 22. Such a silicide extension may occur as a result of structural damage to unprotected portions of nitride spacers 22 during implant 32. As noted above, nitride is susceptible to dissociation by amorphizing implants such as implant 32. This dissociation may create unbound silicon on the surface of dissociated portions of spacers 22, which may then react with overlying metal to form a silicide.

Figure 11:
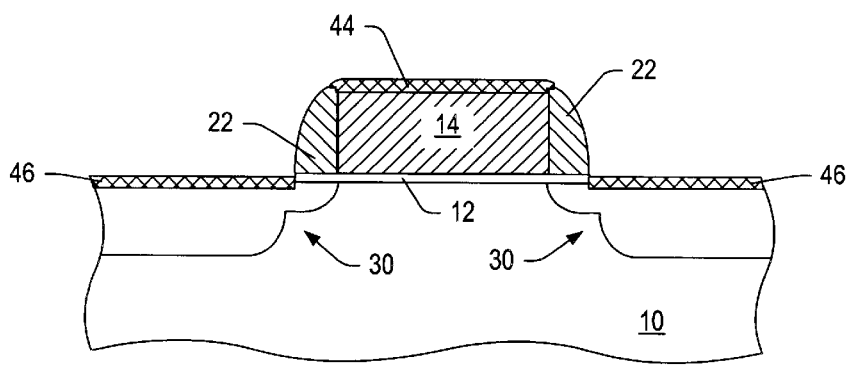
FIG. 11 is a partial cross-sectional view of the semiconductor topography wherein unreacted portions of the metal are removed, subsequent to the silicide formation of FIG. 10.

Unreacted metal is subsequently removed, forming the transistor shown in FIG. 11. This removal is typically accomplished using a wet etch which is selective to the unreacted metal over silicide, silicon, and oxide. A suitable etch for unreacted titanium, for example, may be a 5:1:1 mixture of water, 30% hydrogen peroxide, and ammonium hydroxide. A suitable etch for unreacted cobalt may be a 3:1 mixture of hydrochloric acid and 30% hydrogen peroxide. Removal of unreacted portions of metal layer 40 leaves gate silicide 44 on the upper surface of gate conductor 14 and source and drain silicides 46 on upper surfaces of source and drain regions 30. The nitrogen content in nitride spacers 22 is believed to inhibit possible silicide bridging across spacers 22 during reaction by thermal process 42. The extension of gate silicide 44 over upper ends of spacers 22 is not believed to result in complete silicide bridging, because spacers 22 are substantially protected by oxide caps 26 from nitride dissociation which may cause silicide formation. The use of pre-amorphizing implant 32 is believed to result in a low resistivity for gate silicide 44. In particular, suicide 44 is believed to have a resistivity less than or equal to that of source/drain silicides 46. Further, it is contemplated that the use of nitride for spacers 22 reduces outdiffusion of dopants from source/drain regions 30 and from gate conductor 14 into spacers 22.

Figure 12:
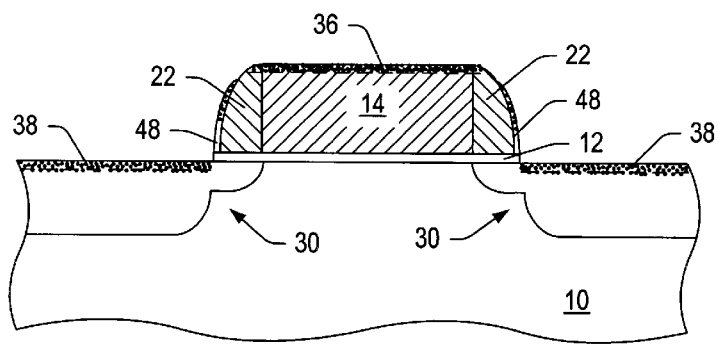
FIG. 12 is a partial cross-sectional view of the semiconductor topography according to an alternative embodiment, wherein portions of the oxide caps remain over the nitride spacers, subsequent to the cleaning of FIG. 8.
Figure 13:
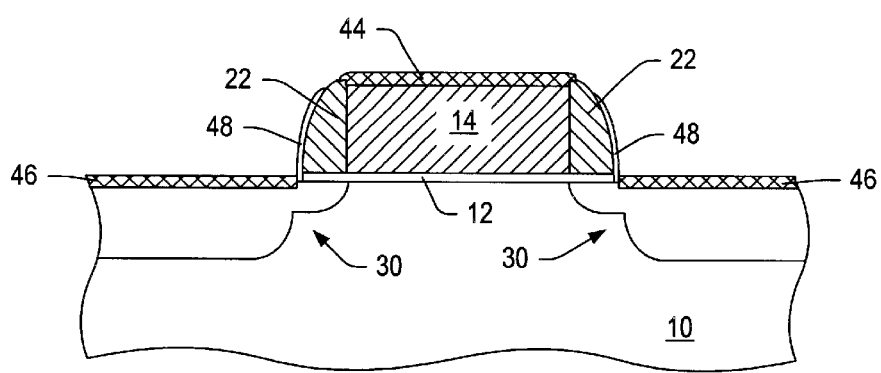
FIG. 13 is a partial cross-sectional view of the semiconductor topography wherein silicides are formed on the transistor of FIG. 12 using the process of FIGS. 10 and 11; subsequent to the oxide cap portion formation of FIG. 12.

In an alternative embodiment shown in FIG. 12, portions 48 of oxide caps 26 may remain on upper surfaces of spacers 22, after the preclean of FIG. 8. Whether portions 48 are left by the preclean and the thickness of portions 48 depend on the thickness of oxide caps 26 and the strength and time of the preclean etch. Performing the salicide process of FIGS. 9–11 on the transistor of FIG. 12 results in the transistor of FIG. 13, in which nitride spacers 22 and oxide portions 48 separate gate silicide 44 from source and drain silicides 46. Although oxide portions 48 may contain structural damage induced by pre-amorphization implant 32, as illustrated using dots within portions 48 in FIG. 12, such damage is not believed to cause silicide bridging across spacers 22. As discussed above, it is postulated that re-formation of dissociated oxide is favored over reaction of silicon from the dissociated oxide with an overlying metal. Oxide portions 48 are therefore shown in FIG. 13 as having had any structural damage removed during the reaction process, and without any overlying silicide.

It will be appreciated to those skilled in the art having the benefit of this disclosure that this invention is believed to provide a transistor having a low-resistance gate silicide and nitride spacers, and a method for forming this transistor. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor comprising:

a polysilicon gate conductor dielectrically spaced above a semiconductor substrate;

an amorphized region within an upper surface of the polysilicon gate conductor;

nitride spacers arranged over the semiconductor substrate, adjacent opposed sidewall surfaces of the gate conductor; and oxide caps adjacent outer surfaces of the nitride spacers, wherein a thickness of each of said oxide caps is approximately equal to a depth at which the amorphized region extends within the upper surface of the polysilicon gate conductor.

2. The transistor as recited in claim 1, wherein said oxide caps contain implanted atoms and structural damage associated with implantation of the implanted atoms.

3. The transistor as recited in claim 2, wherein said implanted atoms comprise silicon or germanium.

4. The transistor as recited in claim 1, wherein said nitride spacers contain insufficient unbound silicon atoms to cause silicide bridging across said nitride spacers.

5. The transistor as recited in claim 1, further comprising a thin oxide interposed between each of the nitride spacers and the semiconductor substrate.

6. A transistor, comprising:

a polysilicon gate conductor dielectrically spaced above a semiconductor substrate;

nitride spacers arranged over the semiconductor substrate, adjacent opposed sidewall surfaces of the gate conductor;

source and drain silicides arranged upon the semiconductor substrate, adjacent opposed lateral surfaces of the nitride spacers; and a gate silicide arranged upon an upper surface of the polysilicon gate conductor, wherein a resistivity of the gate silicide is less than or equal to a resistivity of the source and drain silicides, and wherein said nitride spacers contain insufficient unbound silicon atoms to cause bridging of said source, drain, or gate silicides across said nitride spacers.

7. The transistor as recited in claim 6, further comprising a thin oxide interposed between each of the nitride spacers and the semiconductor substrate.

8. The transistor as recited in claim 6, wherein said source, drain and gate silicides comprise cobalt.

9. The transistor as recited in claim 6, wherein said source, drain and gate silicides comprise titanium.

10. The transistor as recited in claim 6, further comprising oxide cap portions arranged upon upper surfaces of the nitride spacers.

11. The transistor as recited in claim 6, wherein a length of said polysilicon gate conductor, between said opposed sidewall surfaces of the gate conductor, is less than or equal to 0.5 micron.

12. The transistor as recited in claim 1, wherein said amorphized region resides only within said upper surface of the polysilicon gate conductor.

* * * * *